United States Patent
Nakamura

(10) Patent No.: US 7,118,932 B2
(45) Date of Patent: Oct. 10, 2006

(54) METHOD OF MANUFACTURING WAVEGUIDE TYPE OPTICAL ELEMENT AND INTEGRATED OPTICAL WAVEGUIDE TYPE ELEMENT USING WAVEGUIDE TYPE OPTICAL ELEMENT

(75) Inventor: Koji Nakamura, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 825 days.

(21) Appl. No.: 10/059,149

(22) Filed: Jan. 31, 2002

(65) Prior Publication Data

US 2003/0081923 A1    May 1, 2003

(30) Foreign Application Priority Data

Nov. 1, 2001    (JP) .......................... 2001-336642

(51) Int. Cl.
*H01L 21/00*    (2006.01)

(52) U.S. Cl. .................. 438/31; 438/16; 438/35; 257/13; 257/22; 257/84; 257/94; 257/103; 257/184; 257/432

(58) Field of Classification Search ............ 257/13, 257/22, 84, 94, 103, 431, 432; 438/16, 31, 438/35
See application file for complete search history.

(56) References Cited

U.S. PATENT DOCUMENTS

| | | | | |
|---|---|---|---|---|
| 5,729,030 A | * | 3/1998 | Yamamoto et al. | 257/103 |
| 5,990,496 A | * | 11/1999 | Kunisato et al. | 257/94 |
| 6,242,761 B1 | * | 6/2001 | Fujimoto et al. | 257/94 |
| 6,541,297 B1 | * | 4/2003 | Takahashi | 438/31 |
| 6,590,918 B1 | * | 7/2003 | Mannou et al. | 372/45 |

FOREIGN PATENT DOCUMENTS

| | | |
|---|---|---|
| JP | 09199788 | 7/1997 |
| JP | 2000286507 | 10/2000 |

* cited by examiner

*Primary Examiner*—Douglas A. Wille
(74) *Attorney, Agent, or Firm*—Volentine Francos & Whitt, PLLC

(57) ABSTRACT

A method of manufacturing a waveguide type optical element wherein Zn is selectively diffused on a light absorption layer using an undoped InP layer. Since an impurity diffusion area is made on the light absorption layer under a ridge part, a depletion layer becomes thin in a thickness direction and an electric field can strongly be applied. Thereby, an extinction ratio characteristic of a device can be improved.

17 Claims, 20 Drawing Sheets

METHOD OF MANUFACTURING WAVEGUIDE TYPE OPTICAL ELEMENT AND INTEGRATED OPTICAL WAVEGUIDE TYPE ELEMENT USING WAVEGUIDE TYPE OPTICAL ELEMENT

BACKGROUND OF THE INVENTION

1. Field of the Invention

The present invention relates to a waveguide type optical element, an integrated optical waveguide type element using the waveguide type optical element, and a method of manufacturing the waveguide type optical element and the integrated optical waveguide type element using the waveguide type optical element. More particularly, the present invention relates to a method to improve high speed modulation characteristics by controlling diffusion of p type impurity around a light absorption layer, to the light absorption layer.

2. Description of the Related Art

As a related art, there is a reference "Analysis of low voltage/high output in a DFB-LD/modulator integrated source, Singaku Giho QEL95-18 (1995–06)".

Conventionally, a method of performing bury growth has been proposed as a method of forming a window structure to lower a reflectivity on an end face ratio as disclosed in the above reference with respect to waveguide type optical element, in particular, a semiconductor laser with an electro absorption modulator.

Below, a detailed explanation will be described referring to FIGS. 10A–10D.

As shown in FIG. 10A, a grating 2 is partially formed on an InP substrate 1. A pair of selection growth masks 3 is formed on the InP substrate 1. Mask width of the pair of selection growth masks 3 in an area at the side of formation of the grating 2 is wider than mask width of the pair of selection growth masks 3 in the other areas. A multi quantum well layers 4 including a waveguide layer and an activation layer, a light absorption layer 5, and a first clad layer 6 are sequentially select-grown on the InP substrate 1 where the pair of selection growth masks 3 by using a metal organic vaper phase (MOVPE) epitaxy method. An interval of the pair of selection growth masks 3 is about 1 µm to 30 µm and mask width is about 5 µm to 50 µm.

As shown in FIG. 10B, the multi quantum well layers 4, the light absorption layer 5, and the first clad layer 6 are strip-like etched by using an insulation film mask 7.

As shown in FIG. 10C, a second clad layer 8 and a contact layer 9 are formed.

As shown in FIG. 10D, a p type contact electrode 10 for an activation area, and a p type contact electrode 11 for a modulator are deposited. After an n type electrode 12 is deposited, each of electrodes 10, 11, and 12 is alloyed by anneal treatment. After a chip is cloven, a low reflection film 13 is coated.

Each length of a DFB laser area 14, a modulator area 15, and a window area 16 are about 300 µm to 700 µm, 50 µm to 250 µm, and 10 µm to 50 µm, respectively, in a light propagation direction in the conventional waveguide type optical element formed by the above steps.

An absorption coefficient of a light absorption layer is increased and light absorption is increased by applying a reverse voltage to the modulator area in the conventional waveguide type optical element. Increase amount of the absorption coefficient depends on an applied electric field and change amount by the electric field is determined by a structure of the absorption layer. The electric field is proportional to the voltage and is inversely proportional to thickness of a depletion layer. Since frequent characteristics at a time when a high speed modulation signal voltage is applied to a modulator depends on an electrical capacity of an absorption layer, the electrical capacity has to be reduced in a case where high speed modulation characteristics (more than 10 GHz) is required. Therefore, an absorption layer area has to be reduced or thickness of a depletion layer has to be thick. As described above, relation with a structure parameter to increase the absorption layer is a trade off. Not only an electro absorption layer but also thickness of the depletion layer has to be controlled in high speed modulation characteristics of the modulator.

However, crystal growth is performed by the metal organic vaper phase (MOVPE) epitaxy method in a method of forming a conventional waveguide type optical element. In this method, Zn (Zn) is used as p type impurity. This Zn has a feature in which the diffusion coefficient is large and is easily diffused. Since modulation characteristics are changed by Zn diffusion, an accurate control is needed. Especially, when a high frequency signal is supplied, an electric signal is leaked to the waveguide side and the electric capacity is reduced in a case where Zn applied at a time where ridge waveguide growth is diffused to the absorption layer in an inverse mesa ridge waveguide structure which the present invention concerns. Thereby, modulation characteristics are also deteriorated.

SUMMARY OF THE INVENTION

Therefore, it is an object of the present invention to provide a-waveguide type optical element, an integrated optical waveguide type element using the waveguide type optical element, and a method of manufacturing the waveguide type optical element and the integrated optical waveguide type element using the waveguide type optical element in which an area to diffuse impurity is made on a light absorption layer under a ridge part. Thereby, an extinction ratio characteristic of a device can be improved. Since the area to diffuse impurity is not made on the light absorption layer at the side of the ridge part, polarization dependency of the device can be reduced.

According to the present invention, a waveguide type optical element includes: a light absorption layer formed on a compound semiconductor substrate; a ridge part made at a predetermined area on the light absorption layer; and an impurity diffusion area made on the light absorption layer under the ridge part.

According to the present invention, a method of manufacturing a waveguide type optical element includes steps of: forming the light absorption layer on a compound semiconductor substrate, forming a compound semiconductor layer on the light absorption layer, and selectively etching the compound semiconductor layer for forming a ridge part, in which impurity included in the compound semiconductor layer is selectively diffused on the light absorption layer.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

While the specification concludes with claims particularly pointing out and distinctly claiming the subject matter that is regarded as the invention, the invention, along with the objects, features, and advantageous thereof, will be better understood from the following description taken in connection with the accompanying drawings, in which FIGS. 1A to 1D are sectional perspective views for explaining a method of manufacturing a waveguide type optical element of a first embodiment in the present invention.

DETAILED DESCRIPTION OF THE INVENTION

The invention will now be described based on preferred embodiments, which do not intend to limit the scope of the present invention, but rather to exemplify the invention. All of the features and the combinations thereof described in the embodiments are not necessarily essential to the invention.

(First Embodiment)

A method of manufacturing a waveguide type optical element of a first embodiment in the present invention will be described referring to FIGS. 1A to 1D and 2A to 2D. FIGS. 1A to 1D and 2A to 2D are sectional perspective views for explaining a method step of manufacturing the waveguide type optical element of the first embodiment in the present invention.

Figure 1A:
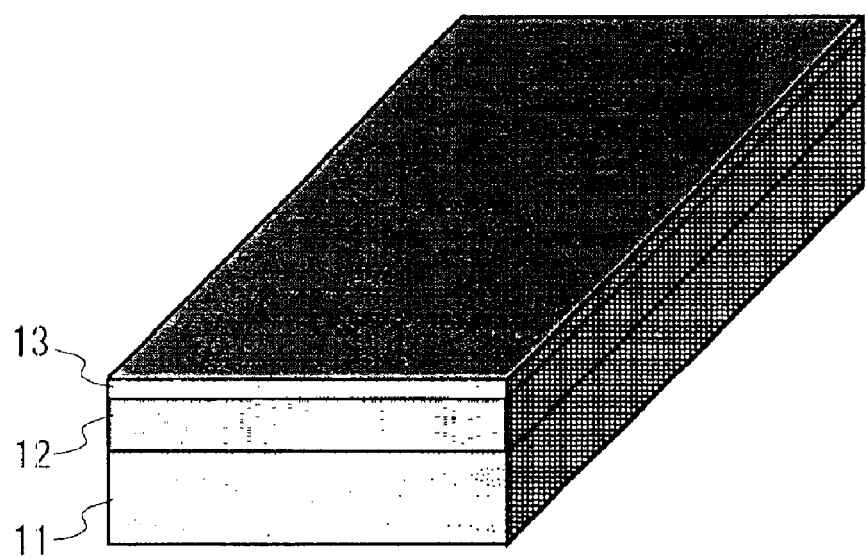

As shown in FIG. 1A, a light absorption layer 12 is formed on an n type InP substrate 11. The light absorption layer 12 is formed by quaternary mixed crystal. An undoped InP layer 13 is formed on the light absorption layer 12. Thickness of the undoped InP layer 13 is 10 nm to 200 nm. At this time, in a case where quantum containment stark effect (QCSE) is used, the light absorption layer 12 is a multi quantum well structure(MQW structure).

Figure 1B:
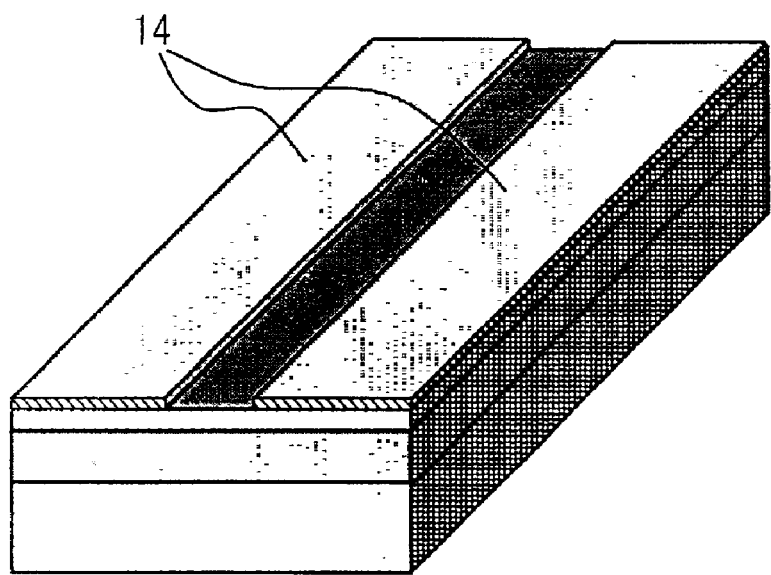

As shown in FIG. 1B, an insulation film mask 14 is formed on the undoped InP layer 13 by photolithography and etching. Width of an aperture of the insulation film mask 14 is approximately 1 μm to 3 μm.

Figure 1C:
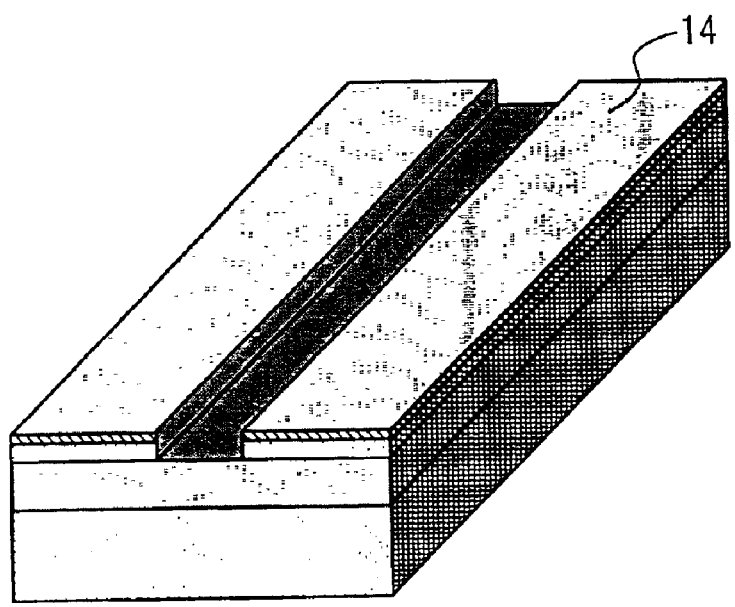

As shown in FIG. 1C, the undoped InP layer 13 is etch-removed using the insulation layer 14 until the light absorption layer 12 is exposed. At this time, since the light absorption layer 12 is formed by quaternary mixed crystal, the light absorption layer 12 can be used as an etching stop layer. An etching removed area is consistent with an area to make a ridge part of the waveguide type optical element.

Figure 1D:
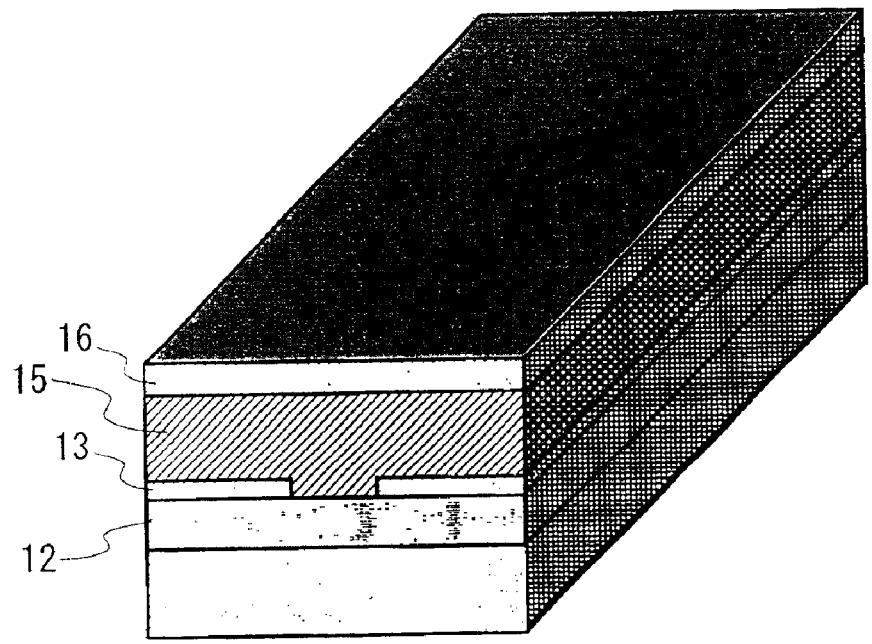

As shown in FIG. 1D, a p type InP clad layer 15 is formed so as to cover the exposed light absorption layer 12 and the undoped InP layer 13. Next, a p type InGaAs contact layer 16 is formed on the p type InP clad layer 15.

As aforementioned above, when the light absorption layer 12 and the p type InP clad layer 15 are MOVPE grown, impurity is not added at a time where the light absorption layer 12 is grown and p type impurity is added at a time where the p type InP clad layer 15 is grown. Zn is chosen as a material added as p type impurity. At this time, amount to diffuse Zn on the absorption layer is controlled by controlling carrier density of Zn. Actually, the layers are grown at 600° C. to 700° C. in MOVPE growth. Time to grow the p type InP clad layer 15 depends on a growth speed. Usually, since the 1 μm or more p type InP clad layer 15 is grown, growth of the p type InP clad layer 15 takes 20 minutes to 60 minutes. Diffusion of Zn is determined by carrier density, temperature and time. A growth condition is controlled in order that Zn is diffused on the light absorption layer 12 by controlling those values. Amount to diffuse Zn is amount to diffuse Zn on a surface of the light absorption layer 12 and the p type InP clad layer 15. It is necessary to control amount to diffuse amount so that the light absorption layer 12 is not perforated.

Figure 2A:
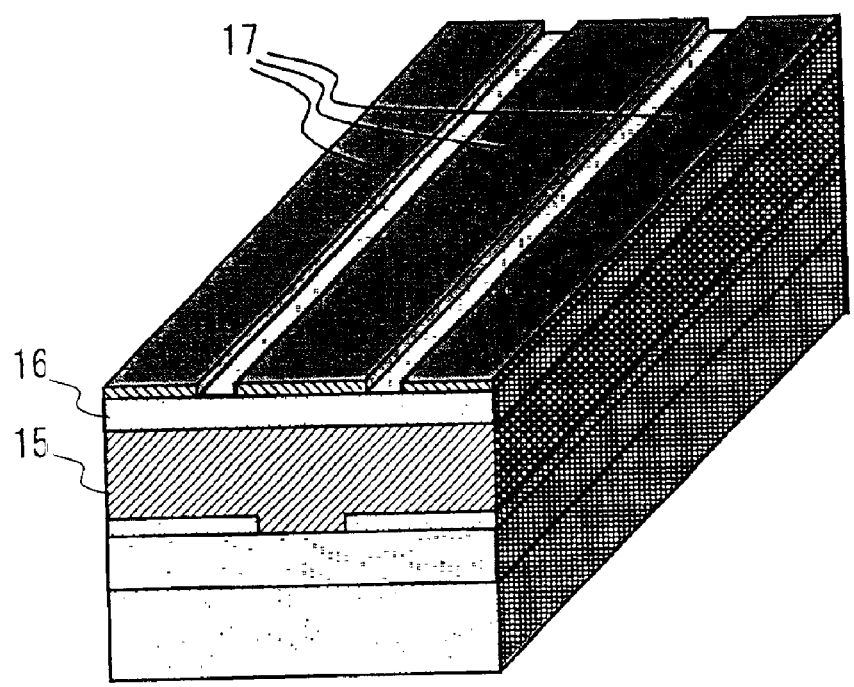
FIGS. 2A to 2D are sectional perspective views for explaining the method of manufacturing the waveguide type optical element of the first embodiment in the present invention.

As shown in FIG. 2A, the insulation layer mask 17 is formed on a p type InGaAs contact layer 16. At this time, the insulation film mask 17 covers an area to make a ridge part, and is formed so, that an aperture is provided at the side of the area to make the ridge part.

Figure 2B:
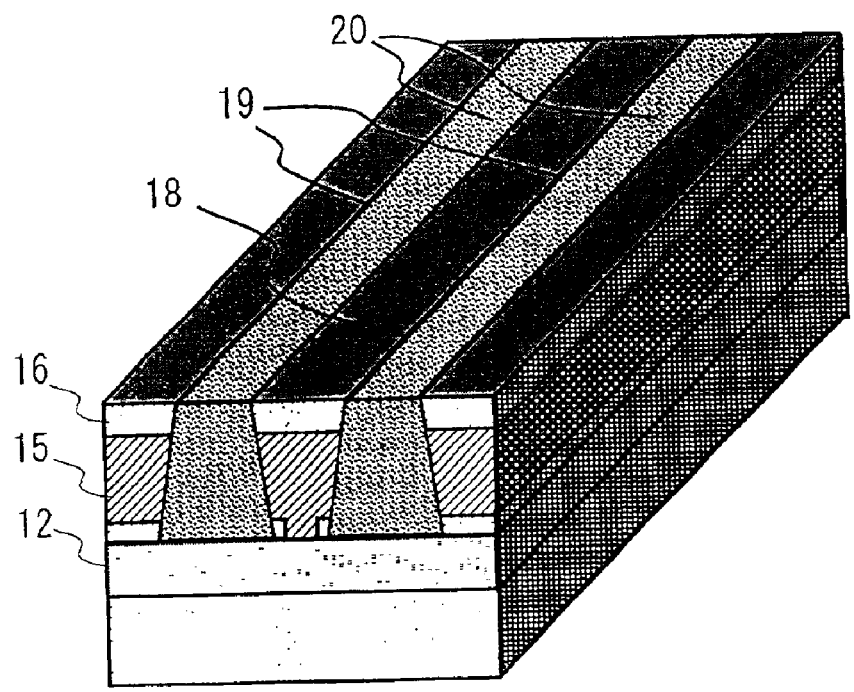

As shown in FIG. 2B, the p type InP clad layer 15 and p type InGaAs contact layer 16 at the side of the area to make the ridge part are etched using the insulation film mask 17 until the light absorption layer 12 is exposed. Concretely, the p type InP clad layer 13 is dry-etched up to a portion right before the light absorption layer 12 and then the undoped InP layer 13 is selectively wet-etched in this step. As a result, a ridge part 18 in a inverse mesa shape is formed. Next, a first insulation layer 19 is formed at a groove at the side of the ridge part 18. A second insulation layer is formed so as to fill in the groove by a polyimide layer.

Figure 2C:
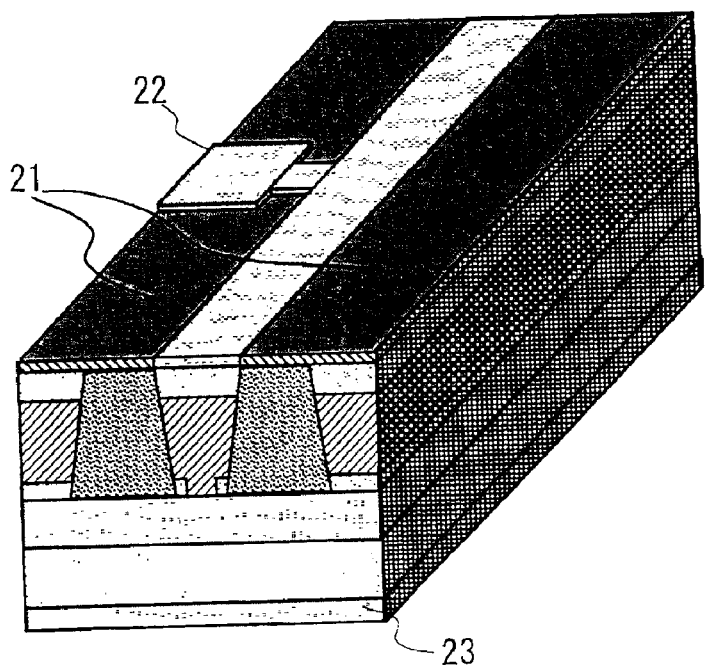

As shown in FIG. 2C, the insulation layer mask 21 is formed on the p type InGaAs contact layer 16 at the side of the ridge part 18 so that the ridge part 18 is exposed. A p type contact electrode 22 is deposited on the p type InGaAs contact layer 16, which is one part of the ridge part 18, and deposited so as to be extended to a predetermined part on the insulation layer mask 21. A p type contact electrode 22 is a pad type electrode shape to reduce an electrode area.

After a back face of the n type InP substrate 11 is abraded so that thickness of the n type InP substrate 11 becomes 100 μm to 200 μm, the n type electrode 23 is deposited on the back face of the n type InP substrate 11. After that, each of electrodes 22 and 23 is alloyed by anneal treatment.

Figure 2D:
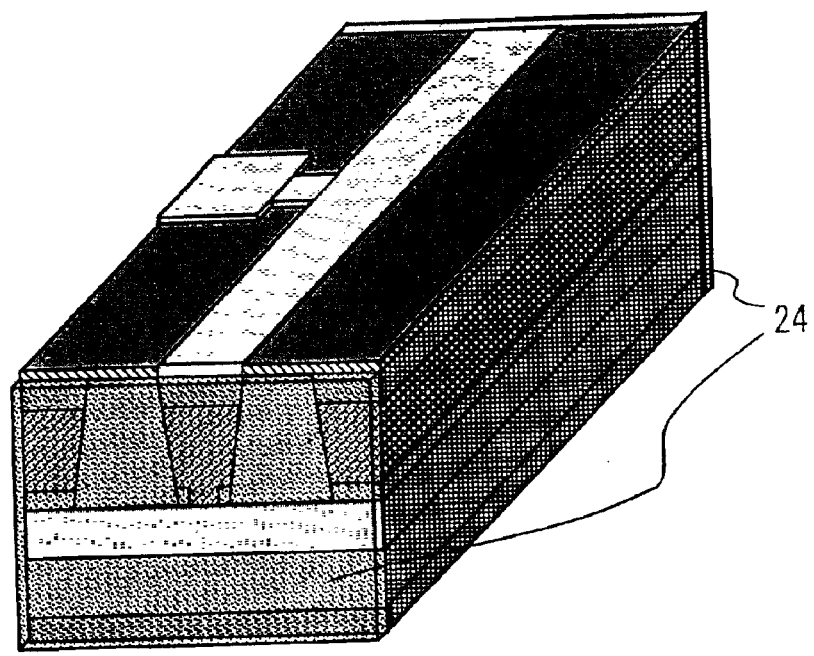

As shown in FIG. 2D, after a chip is cleaved, a low reflection film 24 is coated on end faces where light of the waveguide type optical element enter/exit. Length of the waveguide type optical element is 50 μm to 350 μm in light propagation direction.

A feature of a method of manufacturing the waveguide type optical element of one embodiment in the present invention as described above is to selectively diffuse Zn on the light absorption layer 12 using the undoped InP layer 13. Concretely, diffusion of Zn to the light absorption layer 12 from the p type InP clad layer 15 is suppressed at the side of the ridge part 18 and is actively performed at a portion under the ridge part by forming the undoped InP layer 13 on the light absorption layer 12 at the side of the ridge part 18.

A feature to constitute the waveguide type optical element of the first embodiment in the present invention formed by the steps in FIGS. 1A to 1D and 2A to 2D is to have the light absorption layer formed on a compound semiconductor substrate, the ridge part formed at the predetermined part on the light absorption layer and an area to diffuse impurity made on the light absorption layer under the ridge part.

Therefore, in the waveguide type optical element of the first embodiment in the present invention, since the area to diffuse impurity is made on the light absorption layer under the ridge part, a depletion layer becomes thin in a thickness direction and an electric field can strongly be applied. Thereby, an extinction ratio characteristic of a device can be improved.

Further, since the area to diffuse impurity is not made on the light absorption layer at the side of the ridge part, polarization dependency of the device can be reduced. If Zn of 0.1 μm is diffused on the light absorption layer and the area to diffuse impurity is made, E/O response is deteriorated at a low frequency area. This is because a depletion layer area in appearance is increased and the depletion layer is thin since a frequency component is leaked in a lateral direction, and an electric capacity is deteriorated and the frequency is depended. According to the waveguide type optical element of the first embodiment in the present invention, leakage of the high frequency component in the lateral direction stops and thereby deterioration of a frequency characteristic is wore away.

The area to diffuse impurity made in the light absorption layer under the ridge part is made by diffusion of Zn to the light absorption layer 12 from the p type InP clad layer 15, and depth (Xj) of the area to diffuse impurity is depth which is not up to the surface of the light absorption layer and the compound semiconductor substrate. By setting depth of the area to diffuse impurity, an electric field can efficiently be applied onto the light absorption layer. Therefore, the extinction ratio characteristic of the device can suitably be improved.

When the device with long wavelength is oscillated, a clad layer and the compound semiconductor substrate which constitute the ridge part are formed of InP. When the device with short wavelength is oscillated with short wavelength, the clad layer and the compound semiconductor substrate which constitute the ridge part are formed of GaAs.

From a view point at which a diffusion speed is fast, Zn is suitable, however, magnesium (Mg) or beryllium (Be) can be employed as a suggestion.

A method of manufacturing an integrated optical waveguide type element using the waveguide type optical element of the first embodiment in the present invention, in particular, a method of manufacturing an integrated optical waveguide type element applied for an optical amplifier or an optical modulator, which integrates distribution feedback laser (DFB-LD) as the waveguide type optical element using the waveguide type optical element of the first embodiment in the present invention will be described referring to FIGS. 3A through 5B.

FIGS. 3A through 5B are sectional perspective views for explaining a method of manufacturing the integrated optical waveguide type element using the waveguide type optical element of the first embodiment in the present invention.

Figure 3A:
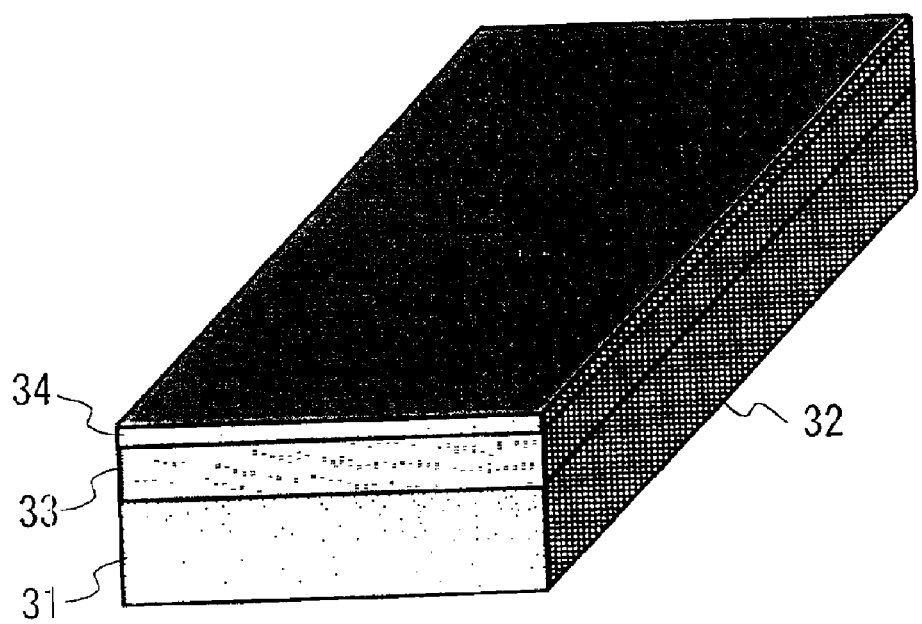
FIGS. 3A to 3D are sectional perspective views for explaining a method of manufacturing an integrated optical waveguide type element using the waveguide type optical element of the first embodiment in the present invention.

As shown in FIG. 3A, grating 32 is formed on an n type InP substrate 31 by photolithography and etching using an interference exposure technique. An activation layer 33 and a p type InP layer 34 are crystal-grown.

Figure 3B:
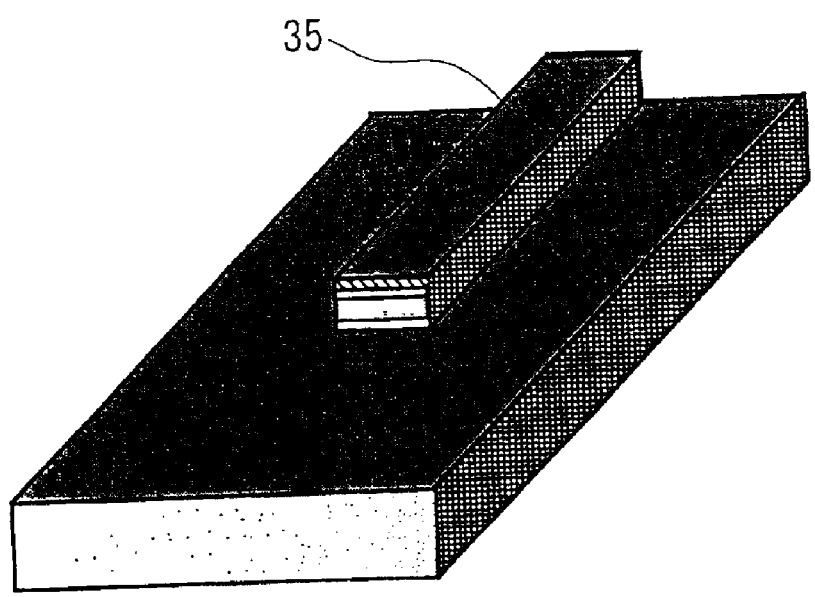

As shown in FIG. 3B, a striped insulation film mask 35 is formed and the side is etched. At this time, grating 32 formed on the n type InP substrate 31 is also removed by etching.

Figure 3C:
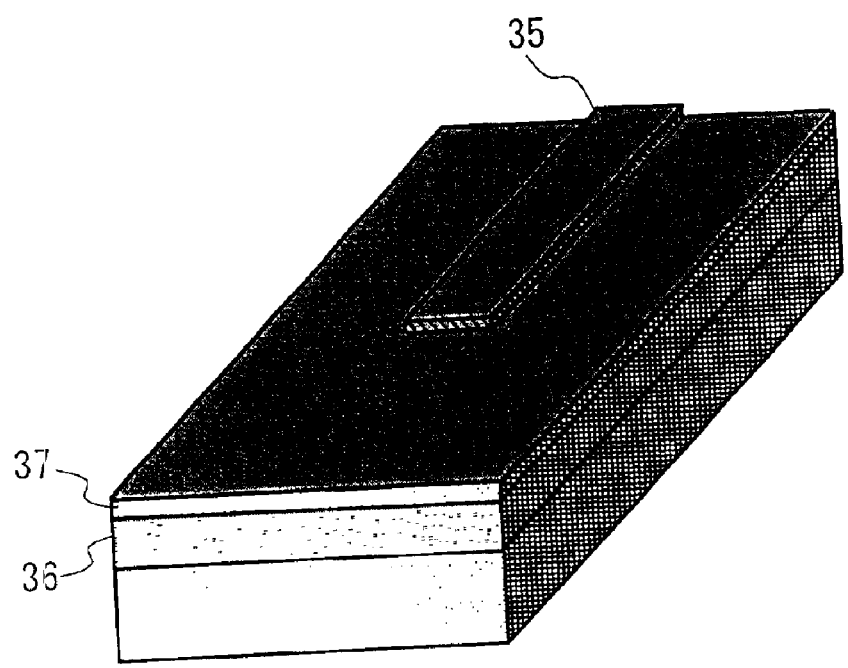

As shown in FIG. 3C, a light absorption layer 36 and an undoped InP layer 37 are formed by crystal growth. An absorption layer structure is an MQW structure in a case where a QCSE is used. Thickness of the undoped InP layer 37 is 10 nm to 300 nm.

Figure 3D:
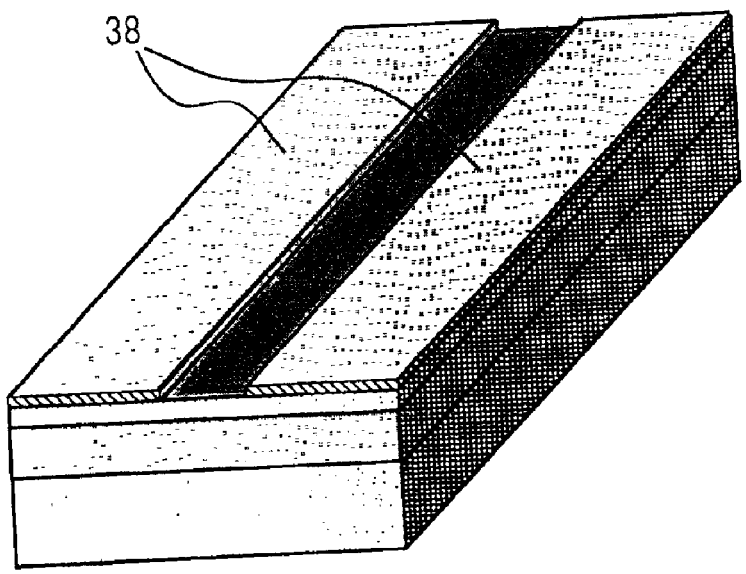

As shown in FIG. 3D, an insulation film mask 38 is formed and the insulation film mask 38 is formed by photolithography and etching. At this time, an interval of the mask is 1 μm to 3 μm.

Figure 4A:
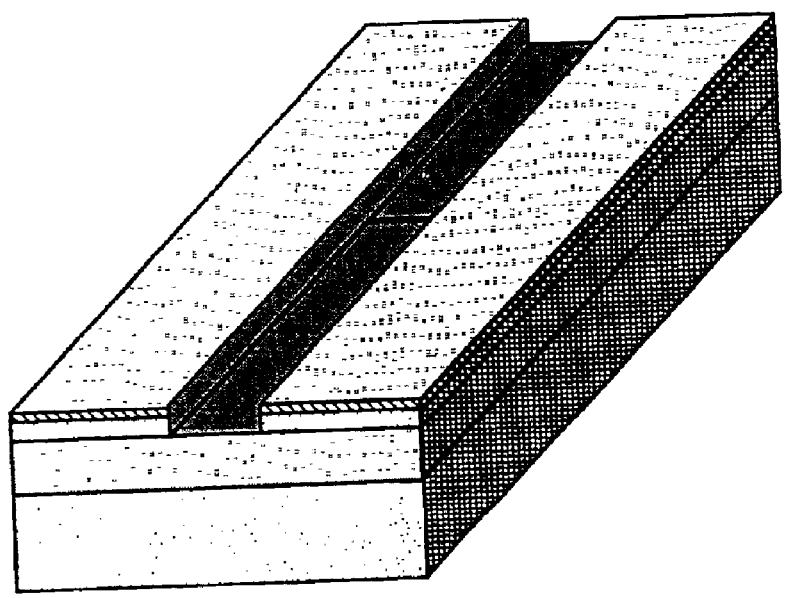
FIGS. 4A to 4D are sectional perspective views for explaining a method of manufacturing an integrated optical waveguide type element using the waveguide type optical element of the first embodiment in the present invention.

As shown in FIG. 4A, a part where the mask of the undoped InP layer 37 is not formed is selectively removed by etching. At this time, the absorption layer formed by quaternary mixed crystal is used as the etching stop layer.

Figure 4B:
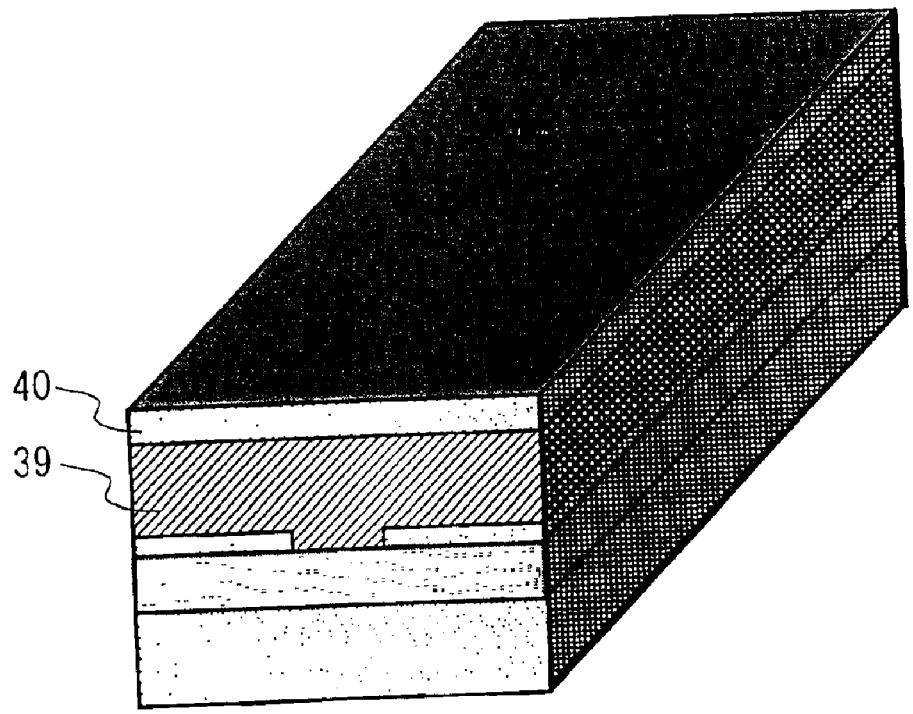

As shown in FIG. 4B, a p type InP clad layer 39 and a p type InGaAs contact layer 40 are crystal-grown.

As aforementioned above, when the light absorption layer 36 and the p type InP clad layer 39 are MOVPE grown, impurity is not added at a time where the light absorption layer 36 is grown and p type impurity is added at a time where the p type InP clad layer 39 is grown. Zn is chosen as a material added as p type impurity. At this time, amount to diffuse Zn on the light absorption layer 36 is controlled by controlling carrier density of Zn. Actually, the layers are grown at 600° C. to 700° C. in MOVPE growth. Time to grow the p type InP clad layer 15 depends on a growth speed. Usually, since the 1 μm or more p type InP clad layer 15 is grown, growth of the p type InP clad layer 15 takes 20 minutes to 60 minutes. Diffusion of Zn is determined by carrier density, temperature and time. A growth condition is controlled in order that Zn is diffused on the light absorption layer 36 by controlling those values. Amount to diffuse Zn is amount to diffuse Zn on a surface of the light absorption layer 36 and the p type InP clad layer 39. It is necessary to control amount to diffuse amount so that the light absorption layer 36 is not perforated.

Figure 4C:
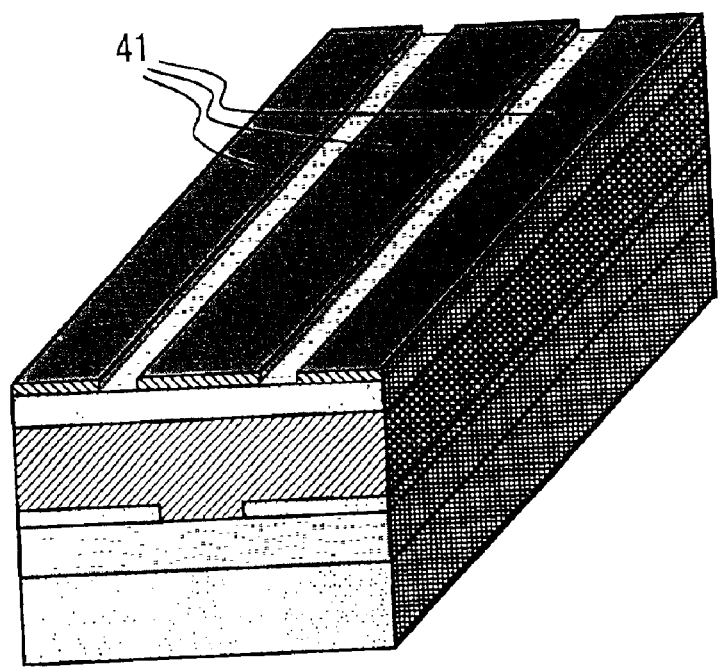

As shown in FIG. 4C, an insulation film mask 41 is formed.

Figure 4D:
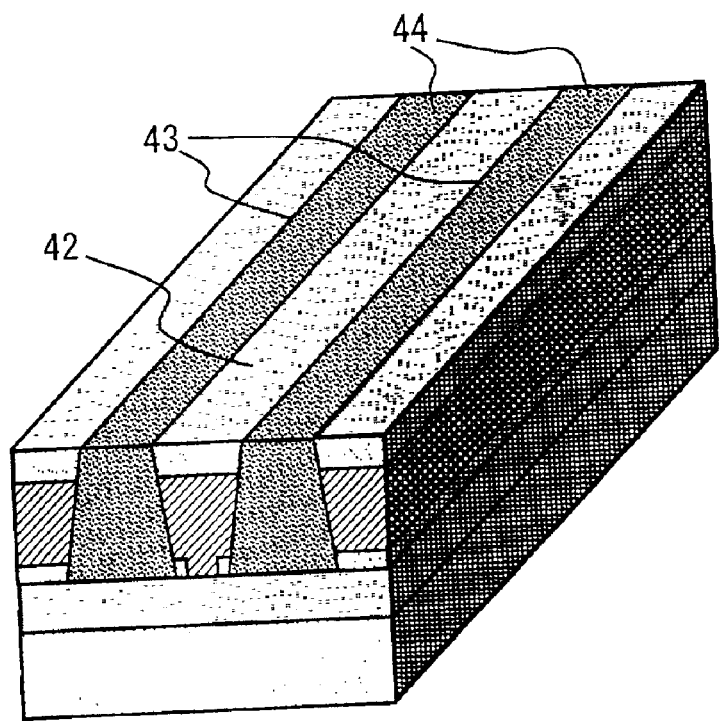

As shown in FIG. 4D, etching is performed using the insulation film mask 41. At this time, firstly dry-etching is performed up to a portion right before the light absorption layer 36 and, next, the p type InP clad layer 39 is selectively etched by wet-etching. A shape at this time becomes an inverse mesa shape and a ridge part 42 is formed. After an insulation film 43 at the side of the ridge part is deposited, polyimide 44 fills in a groove.

Figure 5A:
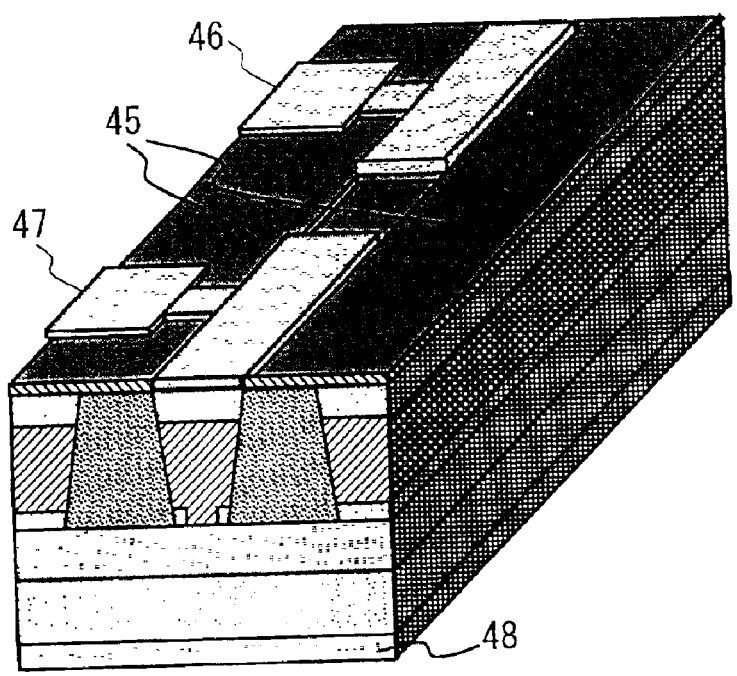
FIGS. 5A and 5B are sectional perspective views for explaining a method of manufacturing an integrated optical waveguide type element using the waveguide type optical element of the first embodiment in the present invention.

As shown in FIG. 5A, an insulation layer 45 is formed, and p type contact electrode 46 for an activation area and p type contact electrode 47 for a modulator are deposited. Each p type contact electrode is a pad type electrode shape to reduce an electrode area. An n type InP substrate is abraded so that thickness of the n type InP substrate becomes 100 μm to 200 μm. After an n type electrode 48 is deposited, each electrode is alloyed by anneal treatment.

Figure 5B:
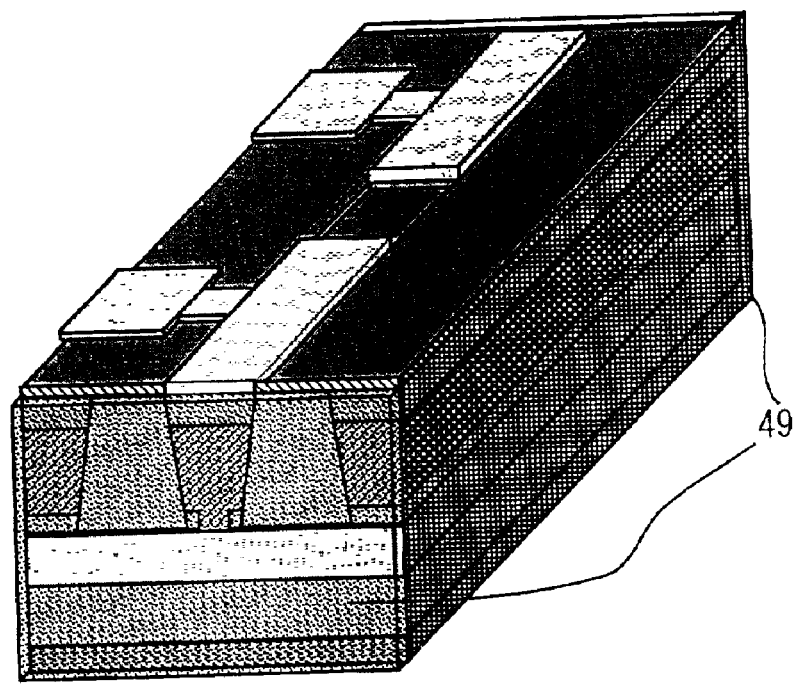

As shown in FIG. 5B, after a chip is cleaved, a low reflection film 49 is coated. Length of an activation area is 100 μm to 550 μm and a modulation area is 50 μm to 350 μm.

A feature of a method of manufacturing the waveguide type optical element of one embodiment in the present invention as described above is to selectively diffuse Zn on the light absorption layer using the undoped InP layer. Concretely, diffusion of Zn to the light absorption layer from the p type InP clad layer is suppressed at the side of the ridge part and is actively performed at a portion under the ridge part by forming the undoped InP layer on the light absorption layer at the side of the ridge part.

A feature to constitute the waveguide type optical element of the first embodiment in the present invention formed by the steps in FIGS. 3A through 5B is to have the light absorption layer formed on the compound semiconductor substrate, the ridge part formed at the predetermined part on the light absorption layer and the area to diffuse impurity made on the light absorption layer under the ridge part.

Therefore, in the waveguide type optical element of the first embodiment in the present invention, since the area to diffuse impurity is made on the light absorption layer under the ridge part, a depletion layer becomes thin in a thickness direction and an electric field can strongly be applied. Thereby, an extinction ratio characteristic of a device can be improved.

Further, since the area to diffuse impurity is not made on the light absorption layer at the side of the ridge part, polarization dependency of the device can be reduced. If Zn of 0.1 μm is diffused on the light absorption layer and the area to diffuse impurity is made, E/O response is deteriorated at a low frequency area. This is because a depletion layer area in appearance is increased and the depletion layer is thin since a frequency component is leaked in a lateral direction, and an electric capacity is deteriorated and the frequency is depended. According to the waveguide type optical element of the first embodiment in the present invention, leakage of the high frequency component in the lateral direction stops and thereby deterioration of a frequency characteristic is wore away.

The area to diffuse impurity made in the light absorption layer under the ridge part is made by diffusion of Zn to the light absorption layer from the p type InP clad layer, and depth (Xj) of the area to diffuse impurity is depth which is not up to the surface of the light absorption layer and the compound semiconductor substrate. By setting depth of the area to diffuse impurity, the electric field can efficiently be applied on the light absorption layer. Therefore, the extinction ratio characteristic of the device can suitably be improved.

When the device with long wavelength is oscillated, a clad layer and the compound semiconductor substrate which constitute the ridge part are formed of InP. When the device with short wavelength is oscillated with short wavelength, the clad layer and the compound semiconductor substrate which constitute the ridge part are formed of GaAs.

From a view point at which a diffusion speed is fast, Zn is suitable, however, Mg or Be can be employed as a suggestion.

(Second Embodiment)

A method of manufacturing a waveguide type optical element of a second embodiment in the present invention will be described referring to FIGS. 6A to 6D and 7A to 7C.

FIGS. 6A to 6D and 7A to 7C are sectional perspective views for explaining the method of manufacturing the waveguide type optical element of the second embodiment in the present invention.

Figure 6A:
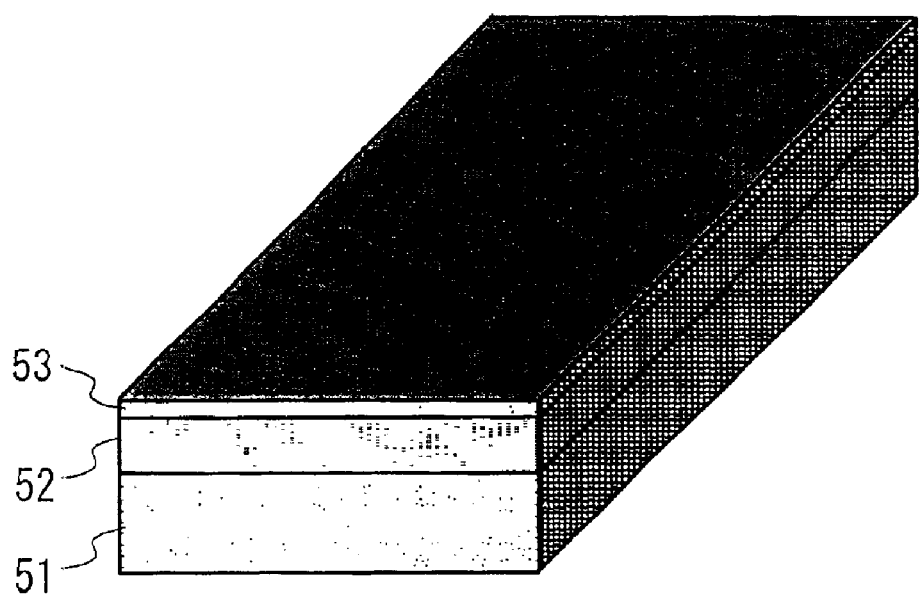
FIGS. 6A to 6D are sectional perspective views for explaining a method of manufacturing a waveguide type optical element of a second embodiment in the present invention.

As shown in FIG. 6A, a light absorption layer 52 and an undoped InP layer 53 are formed on an n type InP substrate 51 by crystal growth. A light absorption layer structure at this time is an MQW structure in a case where a QCSE is used. Thickness of the undrope InP layer 53 is 10 nm to 300 nm.

Figure 6B:
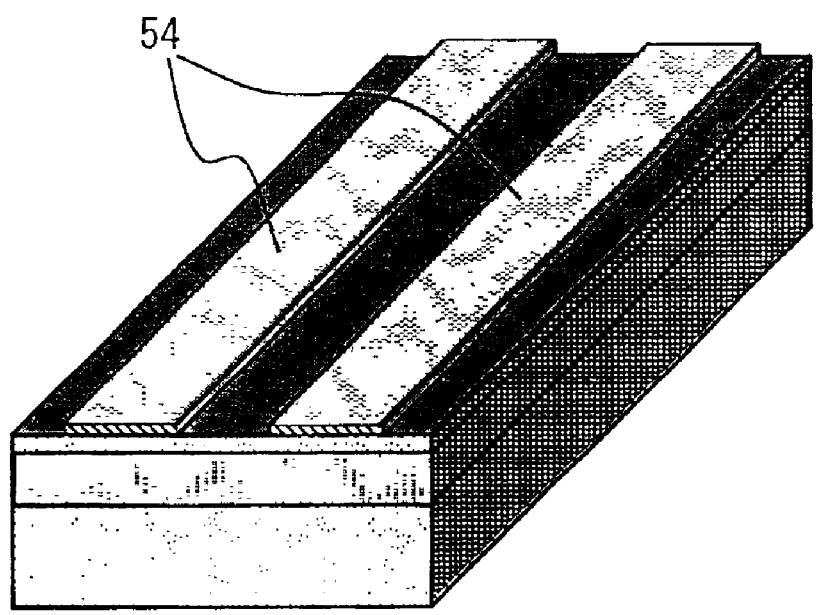

As shown in FIG. 6B, an insulation film mask 54 is formed and the insulation film mask 54 is formed by photolithography and etching. At this time, an interval of the mask is 1 μm to 4 μm and mask width is 3 μm to 50 μm.

Figure 6C:
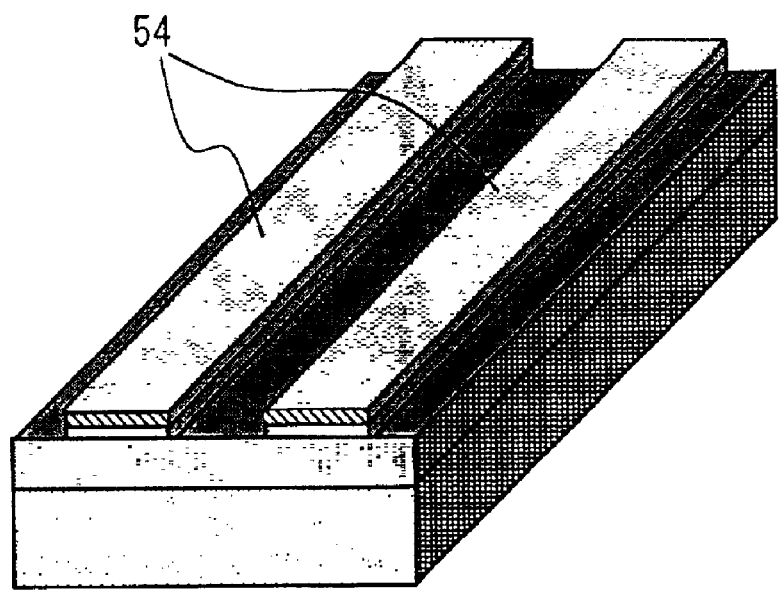

As shown in FIG. 6C, a part where the mask of the undoped InP layer 53 is not formed is selectively removed by etching. At this time, an absorption layer formed by quaternary mixed crystal is used as an etching stop layer. To perform next selection growth, after the mask is once removed, the selection growth mask may newly be formed.

Figure 6D:
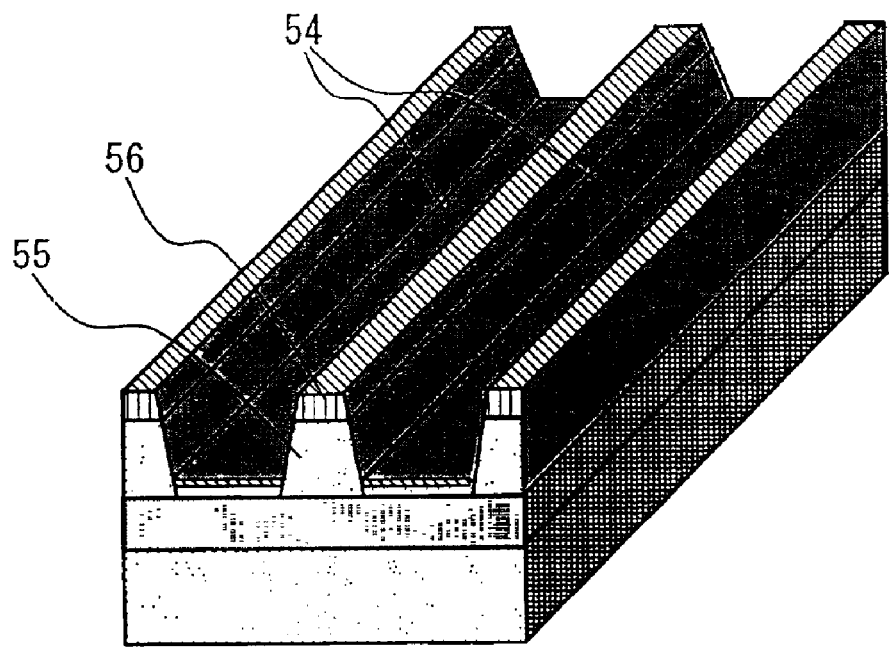

As shown in FIG. 6D, a p type InP clad layer 55 and a p type InGaAs contact layer 56 are crystal-grown. At this time, since a growth speed at a growth area is fast by a value of a mask interval and width, it is necessary to previously be suitable.

As aforementioned above, when the light absorption layer 52 and the p type InP clad layer 55 are MOVPE grown, impurity is not added at a time where the light absorption layer 52 is grown and p type impurity is added at a time where the p type InP clad layer 55 is grown. Zn is chosen as a material added as p type impurity. At this time, amount to diffuse Zn on the light absorption layer 52 is controlled by controlling carrier density of Zn. Actually, the layers are grown at 600° C. to 700° C. in MOVPE growth. Time to grow the p type InP clad layer 55 depends on a growth speed. Usually, since the 1 μm or more p type InP clad layer 55 is grown, growth of the p type InP clad layer 55 takes 20 minutes to 60 minutes. Diffusion of Zn is determined by carrier density, temperature and time. A growth condition is controlled in order that Zn is diffused on the light absorption layer 52 by controlling those values. Amount to diffuse Zn is amount to diffuse Zn on a surface of the light absorption layer 52 and the p type InP clad layer 55. It is necessary to control amount to diffuse amount so that the light absorption layer 52 is not perforated.

Figure 7A:
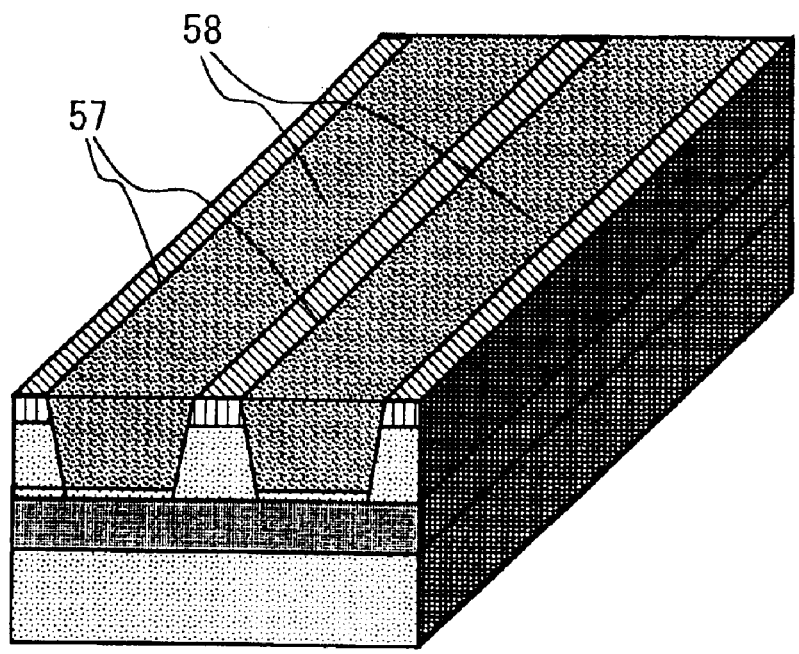
FIGS. 7A to 7C are sectional perspective views for explaining a method of manufacturing a waveguide type optical element of the second embodiment in the present invention.

As shown in FIG. 7A, an insulation film mask 57 is formed and polyimide 58 fills in a groove.

Figure 7B:
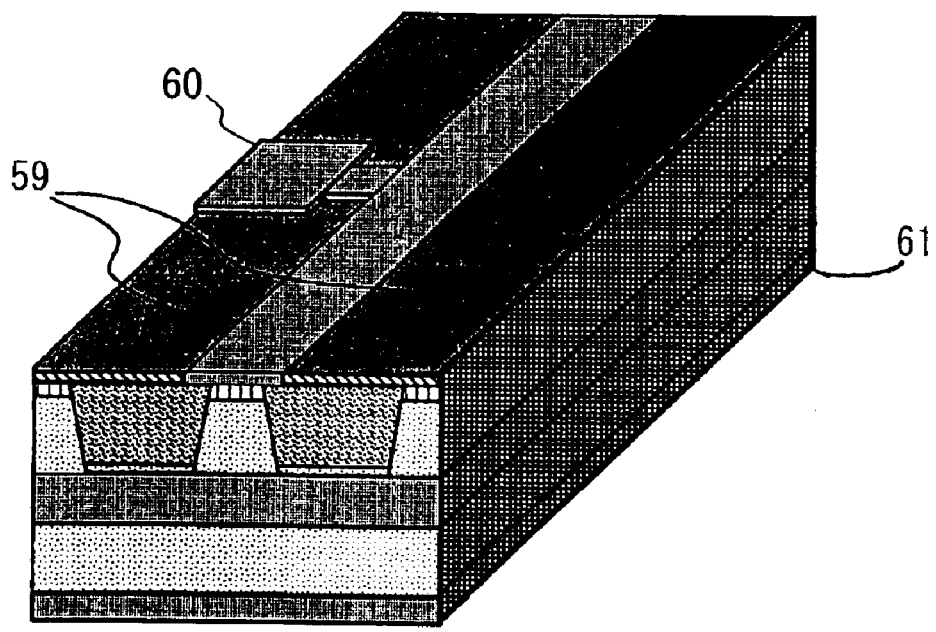

As shown in FIG. 7B, an insulation layer 59 is formed, and a p type contact electrode 60 is deposited. The p type contact electrode is a pad type electrode shape to reduce an electrode area. An n type InP substrate is abraded so that thickness of the n type InP substrate becomes 100 μm to 200 μm. After an n type electrode 61 is deposited, each electrode is alloyed by anneal treatment.

Figure 7C:
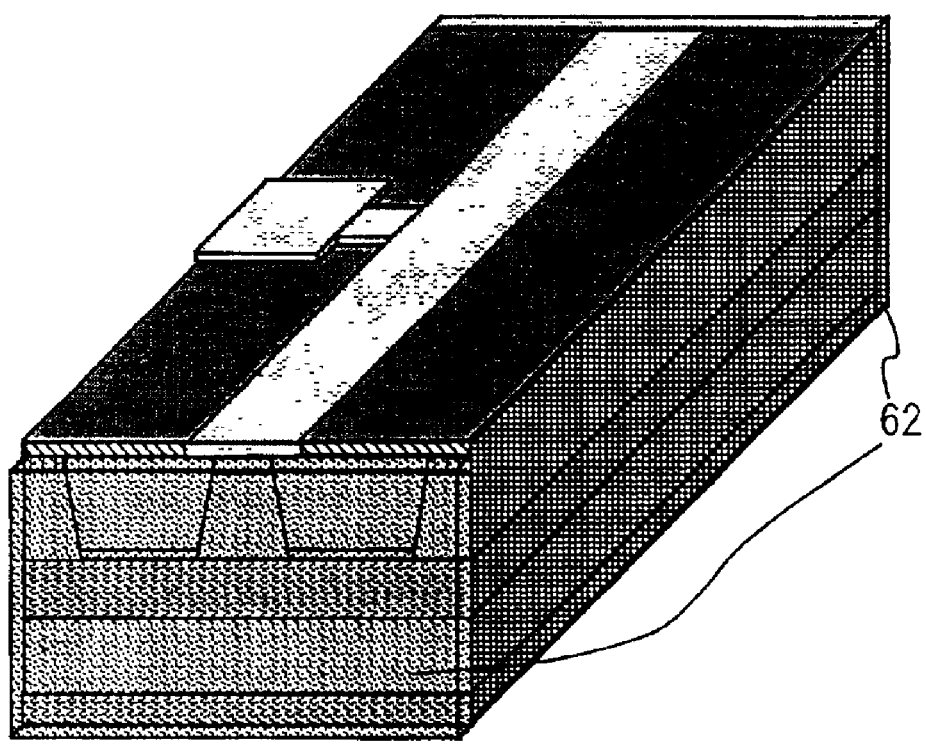

As shown in FIG. 7C, after a chip is cleaved, a low reflection film 62 is coated. Length of each area after the chip is formed is 50 μm to 350 μm.

A feature of a method of manufacturing the waveguide type optical element of the second embodiment in the present invention as described above is to selectively diffuse Zn on the light absorption layer using the undoped InP layer. Concretely, diffusion of Zn to the light absorption layer from the p type InP clad layer is suppressed at the side of the ridge part and is actively performed at a portion under the ridge part by forming the undoped InP layer on the light absorption layer at the side of the ridge part.

A feature to constitute the waveguide type optical element of the second embodiment in the present invention formed by the steps in FIGS. 6A to 6D and 7A to 7C is to have a light absorption layer formed on a compound semiconductor substrate, a ridge part formed at a predetermined part on the light absorption layer and an area to diffuse impurity made on the light absorption layer under the ridge part.

Therefore, in the waveguide type optical element of the second embodiment in the present invention, since the area to diffuse impurity is made on the light absorption layer under the ridge part, a depletion layer becomes thin in a thickness direction and an electric field can strongly be applied. Thereby, an extinction ratio characteristic of a device can be improved. Since the area to diffuse impurity is not made on the light absorption layer at the side of the ridge part, polarization dependency of the device can be reduced. If Zn of 0.1 μm is diffused on the light absorption layer and the area to diffuse impurity is made, E/O response is deteriorated at a low frequency area. This is because a depletion layer area in appearance is increased and the depletion layer is thin since a frequency component is leaked in a lateral direction, and an electric capacity is deteriorated and the frequency is depended. According to the waveguide type optical element of the first embodiment in the present invention, leakage of the high frequency component in the lateral direction stops and thereby deterioration of a frequency characteristic is wore away.

The area to diffuse impurity made in the light absorption layer under the ridge part is made by diffusion of Zn to the light absorption layer from the p type InP clad layer, and depth (Xj) of the area to diffuse impurity is depth which is not up to the surface of the light absorption layer and the compound semiconductor substrate. By setting depth of the area to diffuse impurity, the electric field can efficiently be applied on the light absorption layer. Therefore, the extinction ratio characteristic of the device can suitably be improved.

When the device with long wavelength is oscillated, a clad layer and the compound semiconductor substrate which constitute the ridge part are formed of InP. When the device with short wavelength is oscillated with short wavelength, the clad layer and the compound semiconductor substrate which constitute the ridge part are formed of GaAs.

From a view point at which a diffusion speed is fast, Zn is suitable, however, Mg or Be can also be employed as a suggestion.

A method of manufacturing an integrated optical waveguide type element using the waveguide type optical element of the second embodiment in the present invention, in particularly, a method of manufacturing an integrated optical waveguide type element applied for an optical amplifier or an optical modulator, which integrates a DFB-LD as the waveguide type optical element will be described referring to FIGS. 8A to 8D and 9A to 9E.

FIGS. 8A to 8D and 9A to 9E are sectional perspective views for explaining a method of manufacturing the integrated optical waveguide type element using the waveguide type optical element of the second embodiment in the present invention.

Figure 8A:
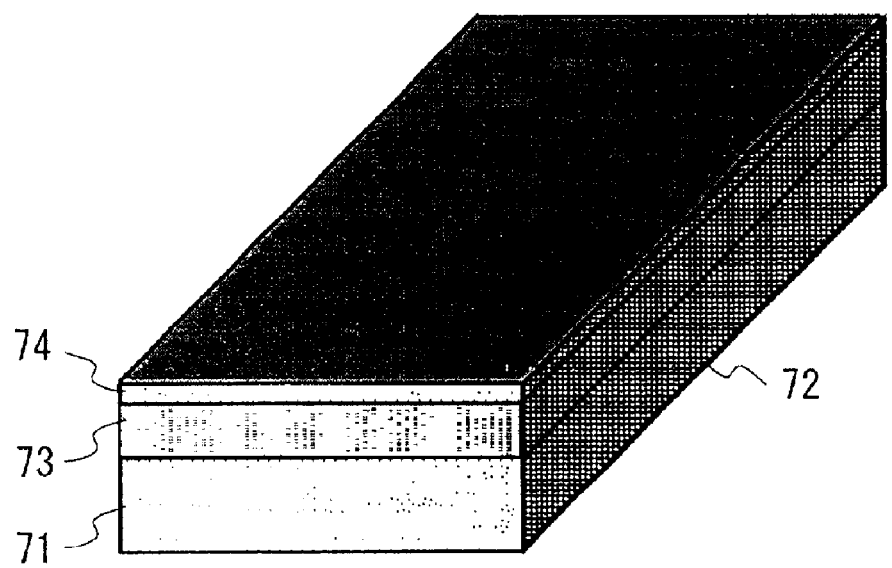
FIGS. 8A to 8D are sectional perspective views for explaining a method of manufacturing an integrated optical waveguide type element using a waveguide type optical element of a second embodiment in the present invention.

As shown in FIG. 8A, grating 72 is formed on an n type InP substrate 71 by photolithography and etching using an interference exposure technique. An activation layer 73 and a p type InP layer 74 are crystal-grown.

Figure 8B:
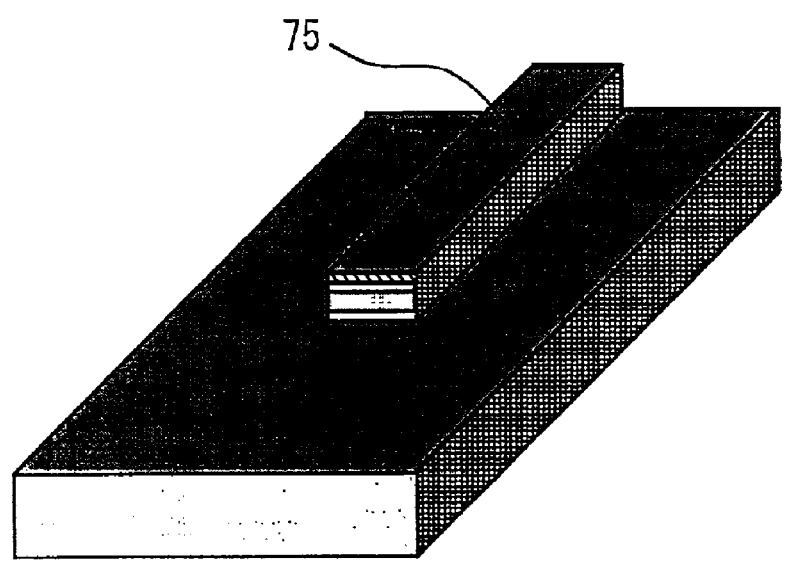

As shown in FIG. 8B, a striped insulation film mask 75 is formed and the side is etched. At this time, grating 72 formed on the n type InP substrate 71 is also removed by etching.

Figure 8C:
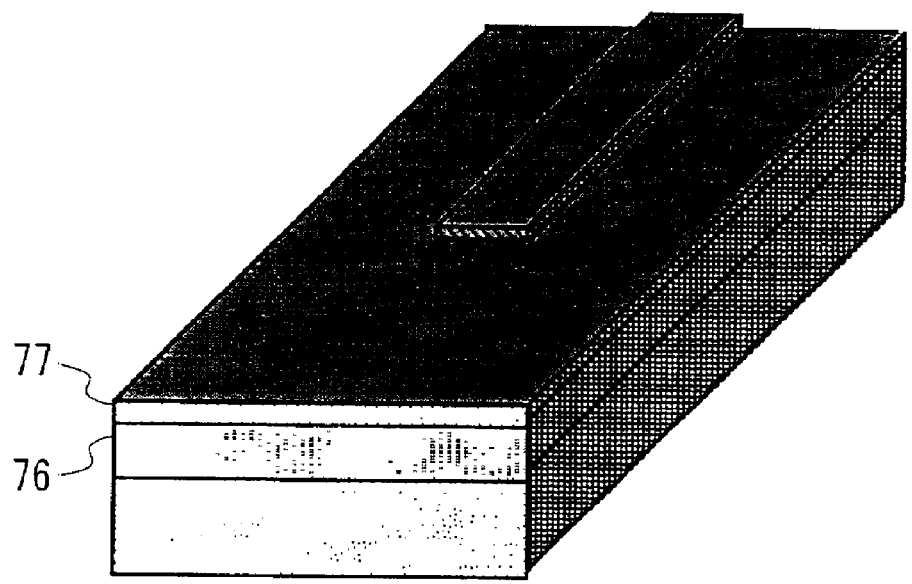

As shown in FIG. 8C, a light absorption layer 76 and an undoped InP layer 77 are formed by crystal growth. An absorption layer structure at this time is an MQW structure in a case where a QCSE is used. Thickness of the undoped InP layer 77 is 10 nm to 300 nm.

Figure 8D:
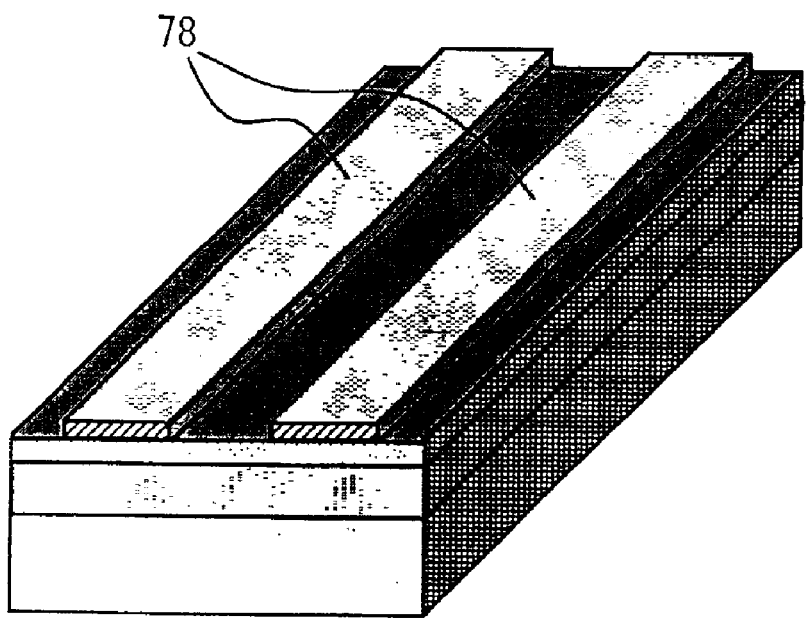

As shown in FIG. 8D, an insulation film mask 78 is formed and the insulation film mask 78 is formed by photolithography and etching. At this time, an interval of the mask is 1 μm to 4 μm and mask width is 3 μm to 50 μm.

Figure 9A:
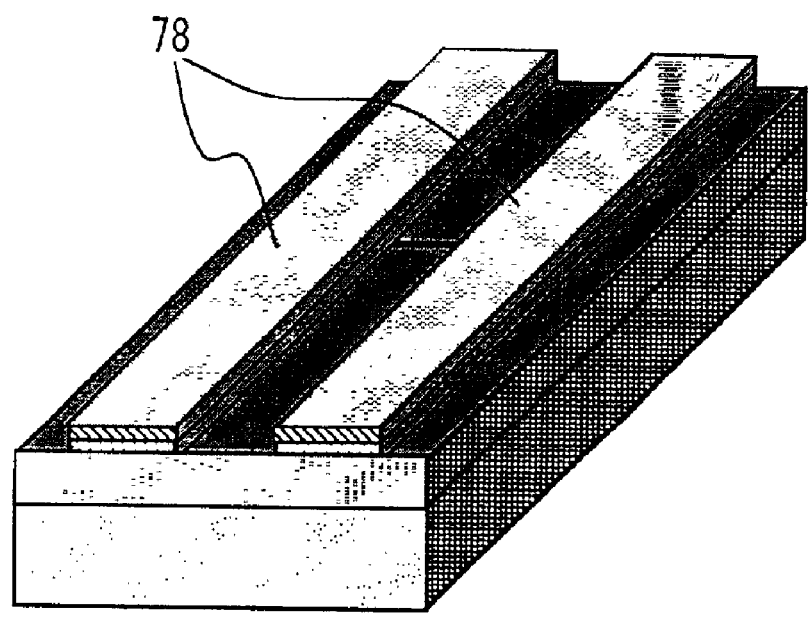
FIGS. 9A to 9E are sectional perspective views for explaining a method of manufacturing the integrated optical waveguide type element using the waveguide type optical element of the second embodiment in the present invention.

As shown in FIG. 9A, a part where the mask of the undoped InP layer 77 is not formed is selectively removed by etching. At this time, the absorption layer formed by quaternary mixed crystal is used as an etching stop layer. To perform next selection growth, after the mask is once removed, the selection growth mask may newly be formed.

Figure 9B:
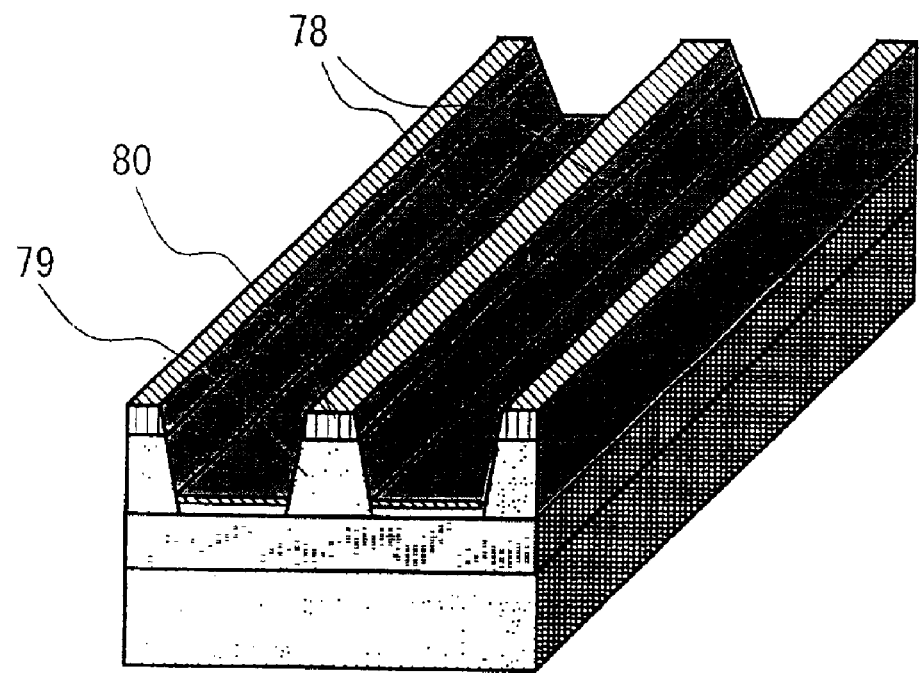

As shown in FIG. 9B, a p type InP clad layer 79 and a p type InGaAs contact layer 80 are crystal-grown. At this time, since a growth speed at a growth area is fast by a value of a mask interval and width, it is necessary to previously be suitable.

As aforementioned above, when the light absorption layer 76 and the p type InP clad layer 79 are MOVPE grown, impurity is not added at a time where the light absorption layer 76 is grown and p type impurity is added at a time where the p type InP clad layer 39 is grown. Zn is chosen as a material added as p type impurity. At this time, amount to diffuse Zn on the light absorption layer 76 is controlled by controlling carrier density of Zn. Actually, the layers are grown at 600° C. to 700° C. in MOVPE growth. Time to grow the p type InP clad layer 79 depends on a growth speed. Usually, since the 1 μm or more p type InP clad layer 79 is grown, growth of the p type InP clad layer 79 takes 20 minutes to 60 minutes. Diffusion of Zn is determined by carrier density, temperature and time. A growth condition is controlled in order that Zn is diffused on the light absorption layer 76 by controlling those values. Amount to diffuse Zn is amount to diffuse Zn on a surface of the light absorption layer 76 and the p type InP clad layer 79. It is necessary to control amount to diffuse amount so that the light absorption layer 76 is not perforated.

Figure 9C:
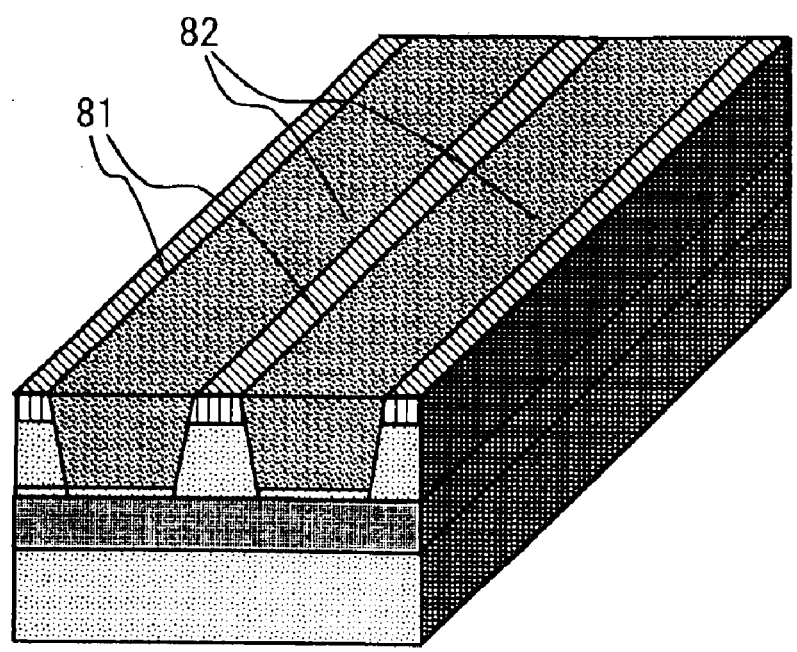

As shown in FIG. 9C, an insulation film mask 81 is formed and polyimide 82 fills in a groove.

Figure 9D:
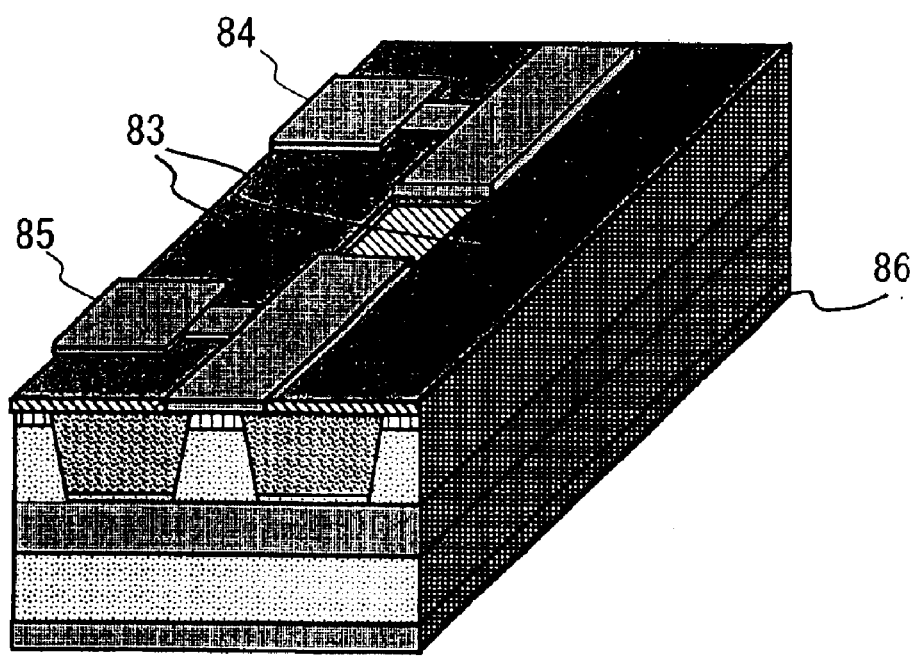

As shown in FIG. 9D, an insulation layer 83 is formed, and p type contact electrode 84 for an activation area and a p type contact electrode 85 for a modulator are deposited. Each p type contact electrode is a pad type electrode shape to reduce an electrode area. An n type InP substrate is abraded so that thickness of the n type InP substrate becomes 100 μm to 200 μm. After an n type electrode 86 is deposited, each electrode is alloyed by anneal treatment.

Figure 9E:
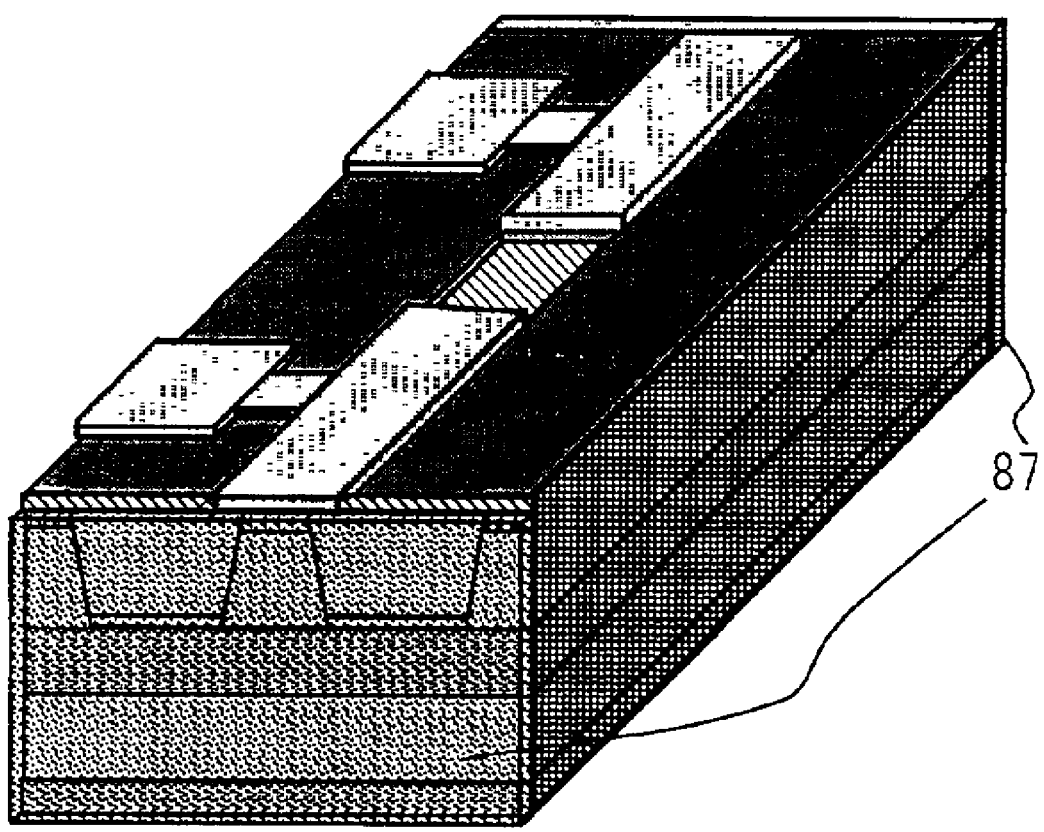
Figure 10A:
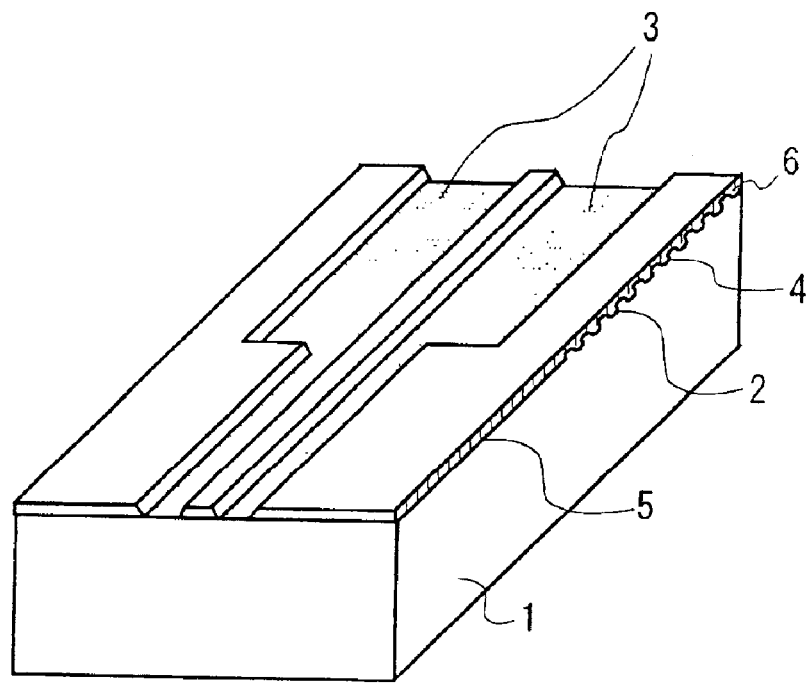
FIGS. 10A to 10D are sectional perspective views for explaining a method of manufacturing a conventional waveguide type optical element.
Figure 10B:
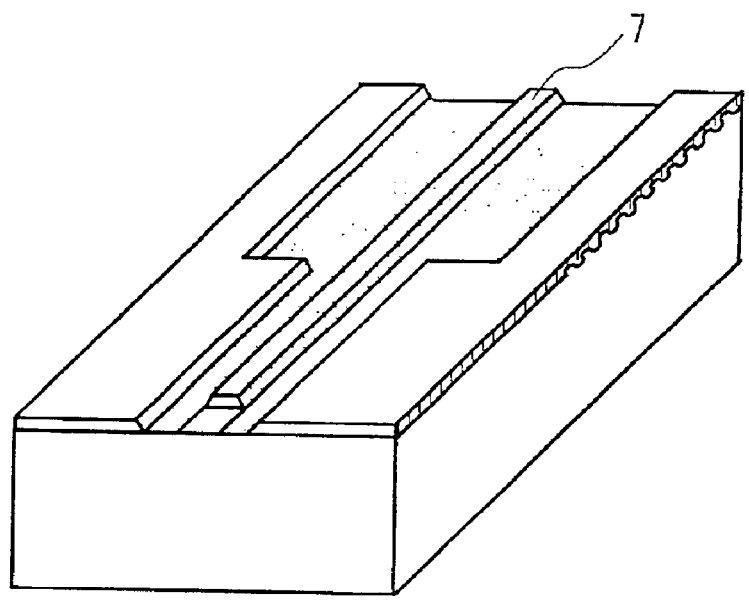
Figure 10C:
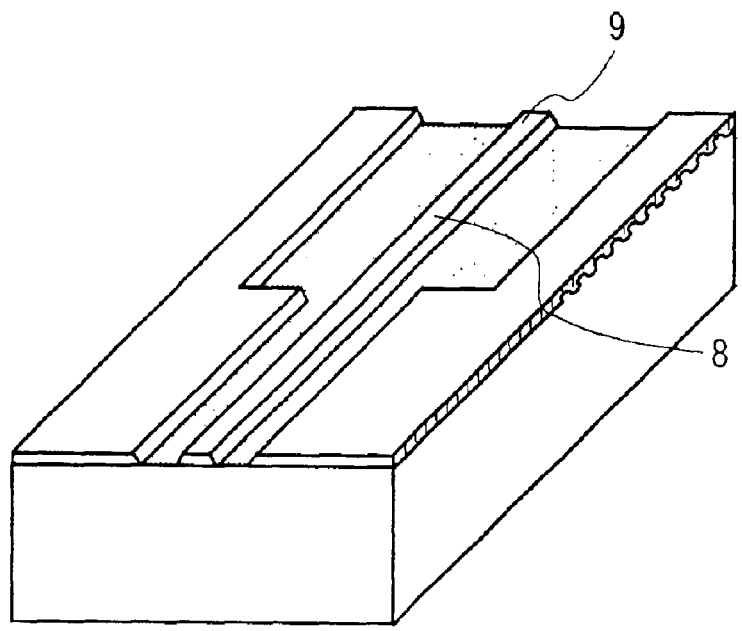
Figure 10D:
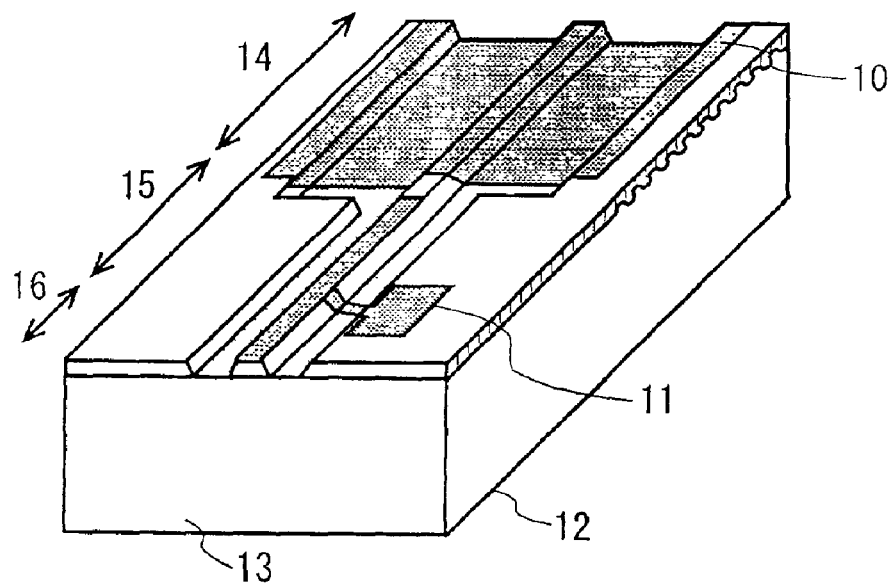

As shown in FIG. 9E, after a chip is cleaved, a low reflection film 87 is coated. Length of an activation area after the chip is formed is 100 μm to 550 μm and a modulation area is 50 μm to 350 μm.

A feature of a method of manufacturing the integrated optical waveguide type element using the waveguide type optical element of the second embodiment in the present invention as described above is to selectively diffuse Zn on the light absorption layer using the undoped InP layer. Concretely, diffusion of Zn to the light absorption layer from the p type InP clad layer is suppressed at the side of the ridge part and is actively performed at a portion under the ridge part by forming the undoped InP layer on the light absorption layer at the side of the ridge part.

A feature to constitute the waveguide type optical element of the second embodiment in the present invention formed by the steps in FIGS. 8A to 8D and 9A to 9E is to have the light absorption layer formed on the compound semiconductor substrate, the ridge part formed at the predetermined part on the light absorption layer and the area to diffuse impurity made on the light absorption layer under the ridge part.

Therefore, in the waveguide type optical element of the second embodiment in the present invention, since the area to diffuse impurity is made on the light absorption layer under the ridge part, a depletion layer becomes thin in a thickness direction and an electric field can strongly be applied. Thereby, an extinction ratio characteristic of a device can be improved.

Further, since the area to diffuse impurity is not made on the light absorption layer at the side of the ridge part, polarization dependency of the device can be reduced. If Zn of 0.1 μm is diffused on the light absorption layer and the area to diffuse impurity is made, E/O response is deteriorated at a low frequency area. This is because a depletion layer area in appearance is increased and the depletion layer is thin since a frequency component is leaked in a lateral direction, and an electric capacity is deteriorated and the frequency is depended. According to the waveguide type optical element of the second embodiment in the present invention, leakage of the high frequency component in the lateral direction stops and thereby deterioration of a frequency characteristic is wore away.

The area to diffuse impurity made in the light absorption layer under the ridge part is made by diffusion of Zn to the light absorption layer from the p type InP clad layer, and depth (Xj) of the area to diffuse impurity is depth which is not up to the surface of the light absorption layer and the compound semiconductor substrate. By setting depth of the area to diffuse impurity, the electric field can efficiently be applied on the light absorption layer. Therefore, the extinction ratio characteristic of the device can suitably be improved.

When the device with long wavelength is oscillated, a clad layer and the compound semiconductor substrate which constitute the ridge part are formed of InP. When the device with short wavelength is oscillated with short wavelength, the clad layer and the compound semiconductor substrate which constitute the ridge part are formed of GaAs.

From a view point at which a diffusion speed is fast, Zn is suitable, however, Mg or Be can be employed as a suggestion.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a waveguide type optical element, comprising:
    forming a light absorption layer on a compound semiconductor layer;
    forming an undoped compound semiconductor layer on the light absorption layer, wherein the undoped compound semiconductor layer includes a first area, second areas located at both sides of the first area, third areas next to the second areas and fourth areas next to the third areas;
    removing the undoped compound semiconductor layer in the first area to expose a part of the light absorption layer;
    forming a clad layer on the exposed light absorption layer, and on the undoped compound semiconductor layer in the second, third and fourth areas;
    removing the clad layer located on the undoped compound semiconductor layer in the third areas, and the undoped compound semiconductor layer in the third areas;
    forming an insulating layer on the clad layer; and
    forming an electrode on the insulating layer.

2. A method of manufacturing a waveguide type optical element as claimed in claim 1, wherein for oscillation with long wavelengths, the compound semiconductor layer and the clad layer are formed of InP.

3. A method of manufacturing a waveguide type optical element as claimed in claim 1, wherein for oscillation with short wavelengths, the compound semiconductor layer and the clad layer are formed of GaAs.

4. A method of manufacturing a waveguide type optical element as claimed in claim 1, wherein an insulation film mask is grown on the undoped compound semiconductor layer as an etching stop layer.

5. A method of manufacturing a waveguide type optical element as claimed in claim 1, wherein an insulation layer is formed at the third areas on the light absorption layer where the clad layer has been removed.

6. A method of manufacturing a waveguide type optical element as claimed in claim 1, further comprising forming a contact layer on the clad layer.

7. A method of manufacturing a waveguide type optical element as claimed in claim 1, wherein said removing the clad layer forms a ridge portion of the clad layer shaped as an inverted mesa, the ridge portion being above the light absorption layer at the first area and above the undoped compound semiconductor layer at the second areas.

8. A method of manufacturing a waveguide type optical element as claimed in claim 1, wherein said forming a clad layer comprises adding an impurity to the clad layer as the clad layer is formed, whereby the impurity diffuses to the light absorption layer at the first area.

9. A method of manufacturing a waveguide type optical element as claimed in claim 8, wherein said forming the clad layer comprises a metal phase epitaxy method.

10. A method of manufacturing a waveguide type optical element as claimed in claim 5, wherein the insulation layer is a polymide.

11. A method of manufacturing a waveguide type optical element as claimed in claim 8, wherein the impurity is Zinc.

12. A method of manufacturing an integrated optical waveguide type element integrating the waveguide type optical element as claimed in any of claims 2–11 into an optical amplifier or an optical modulator.

13. A method of manufacturing a waveguide type optical element comprising:
    forming a light absorption layer on a compound semiconductor layer;
    forming an undoped compound semiconductor layer on the light absorption layer;
    forming a window in the undoped compound semiconductor layer to expose the light absorption layer;
    forming a clad layer on the undoped compound semiconductor layer and on the exposed light absorption layer in the window, an impurity within the clad layer diffusing through the window into the light absorption layer beneath the window;
    selectively removing the clad layer so that an inverted mesa shaped ridge portion of the clad layer remains above the window;
    forming an insulating layer over the clad layer after said selectively removing; and
    forming an electrode on the insulating layer.

14. A method of manufacturing a waveguide type optical element as claimed in claim 13, wherein said forming a clad layer comprises a metal phase epitaxy method.

15. A method of manufacturing a waveguide type optical element as claimed in claim 13, wherein for oscillation with long wavelengths, the compound semiconductor layer and the clad layer are formed of InP.

16. A method of manufacturing a waveguide type optical element as claimed in claim 13, wherein for oscillation with short wavelengths, the compound semiconductor layer and the clad layer are formed of GaAs.

17. A method of manufacturing a waveguide type optical element as claimed in claim 13, wherein the impurity is Zinc.

* * * * *